United States Patent
Kondo et al.

(10) Patent No.: US 6,848,178 B2
(45) Date of Patent: Feb. 1, 2005

(54) ENHANCEMENT OF CURRENT-CARRYING CAPACITY OF A MULTILAYER CIRCUIT BOARD

(75) Inventors: Koji Kondo, Toyohashi (JP); Ryohei Kataoka, Okazaki (JP); Gentaro Masuda, Kariya (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/437,041

(22) Filed: May 14, 2003

(65) Prior Publication Data

US 2003/0222340 A1 Dec. 4, 2003

(30) Foreign Application Priority Data

May 30, 2002 (JP) .................................... 2002-158041

(51) Int. Cl.[7] .............................................. H04K 1/14
(52) U.S. Cl. .................. 29/852; 361/792; 361/760; 438/108; 438/610; 257/678; 257/700; 174/266
(58) Field of Search ............................. 361/795, 792, 361/748, 760; 174/266, 262, 263; 29/852; 257/678, 700, 108, 610; 438/108, 610

(56) References Cited

U.S. PATENT DOCUMENTS

| | | | | |
|---|---|---|---|---|
| 5,883,335 A | * | 3/1999 | Mizumoto et al. | 174/266 |
| 6,139,777 A | * | 10/2000 | Omoya et al. | 252/500 |
| 2002/0094604 A1 | * | 7/2002 | Hayama et al. | |
| 2004/0043596 A1 | * | 3/2004 | Sakaki et al. | |

FOREIGN PATENT DOCUMENTS

JP  A-H10-117069  5/1998

* cited by examiner

Primary Examiner—Kamand Cuneo
Assistant Examiner—Hung S. Bui
(74) Attorney, Agent, or Firm—Posz & Bethards, PLC

(57) ABSTRACT

A multilayer circuit board, in which a plurality of insulating layers and a plurality of conductive layers, each of which includes a conductive pattern, have been laminated, includes an insulating layer, a conductive compound, and a conductive pattern. The insulating layer has a trench. The conductive compound is located in the trench. The conductive pattern adjoins the trench and is electrically connected to the conductive compound. The conductive pattern and the conductive compound make up a conductive wire that has a higher current-carrying capacity than the conductive pattern.

11 Claims, 2 Drawing Sheets

ENHANCEMENT OF CURRENT-CARRYING CAPACITY OF A MULTILAYER CIRCUIT BOARD

CROSS REFERENCE TO RELATED APPLICATION

This application is based on and incorporates herein by reference Japanese Patent Application No. 2002-158041 filed on May 30, 2002.

BACKGROUND OF THE INVENTION

The present invention relates to a multilayer circuit board electrified with a high current and a method for manufacturing the multilayer circuit board.

Multilayer circuit boards have been lately in great demand for densely packaging semiconductor devices and electric components such as a condenser and a resistor. Such a multilayer circuit board can be manufactured, for example, by: stacking conductive pattern films, in each of which conductive patterns made of, for example, copper have been patterned out on a thermoplastic resin film, which is an insulating layer; and integrating the stacked body by heat pressing.

With respect to the above multilayer circuit board, there have been demands, for example, for mounting a power device on the board in order to form a power source circuit or for building a specialty component such as a coil on or in the board in order to diversify the application. In such an instance, it is necessary to electrify the conductive patterns electrically connected to the power device and the coil with a high current, so the conductive patterns need to become relatively thick in order to increase the current-carrying capacity thereof in the above multilayer circuit board.

However, if the current-carrying capacity was increased by thickening the conductive patterns, it would become difficult to miniaturizing the conductive patterns because the etching precision when the conductive patterns are patterned out by etching would worsen. Moreover, if extremely thick conductive patterns were used, the thermoplastic resin films, on which the thick conductive patterns have been formed, could not conformably cover the thick conductive patterns when the thermoplastic resin films are molten by heat pressed. As a result, voids would be generated, or the thermoplastic resin films would be delaminated.

SUMMARY OF THE INVENTION

The present invention has been made in view of the above aspects with an object to increase the current-carrying capacity of a multilayer circuit board without thickening a conductive pattern included in the board.

To achieve the above object, a multilayer circuit board according to the present invention, in which a plurality of insulating layers and a plurality of conductive layers, each of which includes a conductive pattern, have been laminated, includes an insulating layer, a conductive compound, and a conductive pattern. The insulating layer has a trench. The conductive compound is located in the trench. The conductive pattern is located above the trench and electrically connected to the conductive compound. The conductive pattern and the conductive compound make up a conductive wire that has a higher current-carrying capacity than the conductive pattern.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

The present invention will be described in detail with reference to various embodiments.

First Embodiment

Figure 1A:
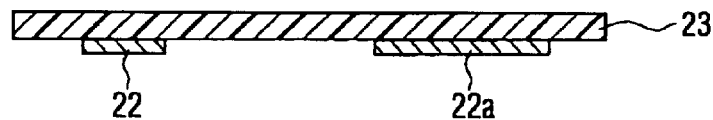
FIGS. 1A to 1E are cross-sectional views showing manufacturing steps for manufacturing a multilayer circuit board according to a first embodiment of the present invention.
Figure 1B:
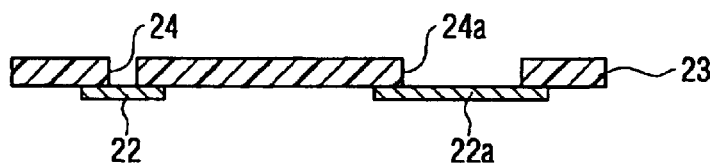
Figure 1C:
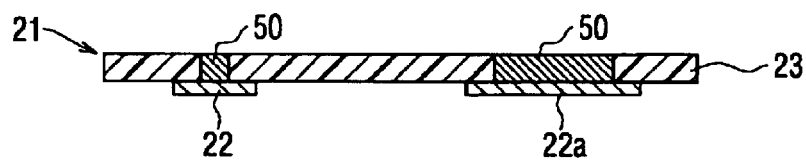
Figure 1D:
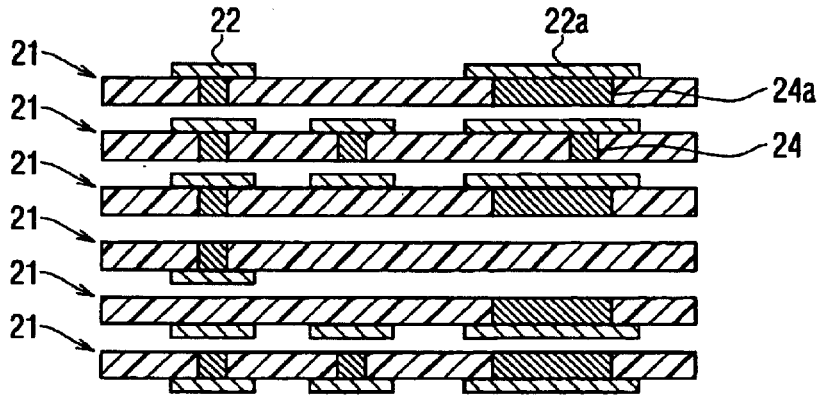
Figure 1E:
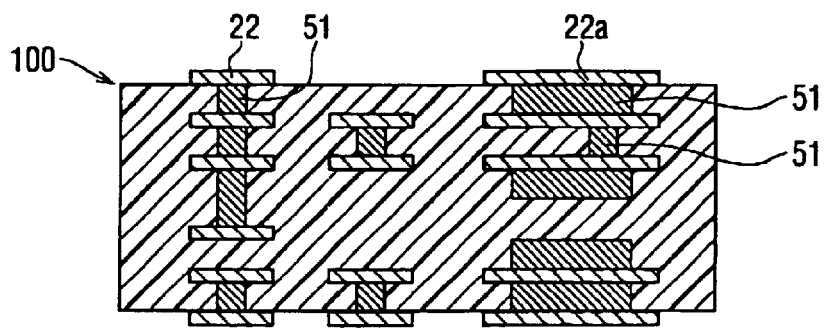

A multilayer circuit board 100 of FIG. 1E according to the first embodiment is manufactured using the steps shown in FIGS. 1A to 1E. First, a single-sided conductive pattern film 21 of FIG. 1C is formed using the steps shown in FIGS. 1A to 1C. First, a copper foil having a thickness of 18 $\mu$m and a thermoplastic resin film 23, which becomes an insulating layer in the multilayer circuit board 100 of FIG. 1E, are laminated, and then the copper foil is patterned into a first conductive pattern 22 and a second conductive pattern 22a by etching, as shown in FIG. 1A.

The conductive pattern 22, 22a are made of copper and have a thickness of 18 $\mu$m. However, the conductive pattern 22, 22a may be made of other metal. In addition, the thickness may not be 18 $\mu$m. However, the thickness is preferably in the range from 5 to 75 $\mu$m in consideration of the etching precision when the conductive pattern 22, 22a are formed by etching and the voids that would otherwise be generated when a plurality of single-sided conductive pattern films 21 of FIG. 1C are integrated by heat pressing at a later step.

The first conductive pattern 22 is used as a wiring line that electrically interconnects semiconductor devices used for making up, for example, a control circuit in the multilayer circuit board 100, so the first conductive pattern 22 is electrified with a relatively low current. On the other hand, the second conductive pattern 22a is used as a wiring line that electrically interconnects components used for making up, for example, a power source circuit or alternatively used for forming a coil in the multilayer circuit board 100, so the second conductive pattern 22a is electrified with a relatively high current.

The thermoplastic resin film 23 of FIG. 1A is made of, what is called, liquid crystal polymer and has a thickness of 75 $\mu$m. The thermoplastic resin film 23 of FIG. 1A is softened at 280 to 300° C., so when a stacked body of a plurality of single-sided conductive pattern films 21 of FIG. 1C is heat pressed at the above temperature at a later step, the thermoplastic resin films 23 of the single-sided conductive pattern films 21 in the stacked body bond together. The thickness of the thermoplastic resin film 23 of FIG. 1A is preferably 10 to 200 $\mu$m in consideration of the easiness in handling and the thickness of the conductive patterns 22, 22a, which need to be conformably covered with the thermoplastic resin films 23 in the stacked body.

After the first and second conductor patterns 22, 22a are completed as shown in FIG. 1A, a via-hole 24 and a trench 24a, which are respectively bottomed by the first and second conductor patterns 22, 22a, are formed using carbon dioxide laser, as shown in FIG. 1B. When the via-hole 24 and the trench 24a are formed, the conductor patterns 22, 22a escape being dug by the laser by adjusting the power and the exposure time period of the carbon dioxide laser. The via-hole 24 has a diameter of 50 to 100 μm. The trench 24a has a width narrower than that of the second conductor pattern 22a to prevent the second conductor pattern 22a, which has been bonded to the thermoplastic resin film 23 by heat pressing, from peeling off.

After the via-hole 24 and the trench 24a are formed as shown in FIG. 1B, a low resistivity interlayer contact material 50, or a low resistivity conductive paste 50, is packed in the via-holes 24, as shown in FIG. 1C. The conductive paste 50 is prepared as follows. A solution, in which 6 g of ethyl cellulose resin is dissolved in 60 g of terpineol, which is organic solvent, is added to 300 g of tin particles with a mean particle size of 5 μm and a specific surface of 0.5 m$^2$/g and 300 g of silver particles with a mean particle size of 1 μm and a specific surface of 1.2 m$^2$/g. The mixture is compounded by a mixer to make it pasty. The ethyl cellulose resin is added to improve the shape-holding ability of the conductive paste 50. As a material for improving the shape-holding ability, acrylic resin may be used.

After the conductive paste 50 is printed and packed in the via-hole 24 and the trench 24a by a screen-printing machine using a metal mask, the terpineol is evaporated at 140–160° C. for about 30 minutes. At a step shown in FIG. 1C, the screen-printing machine is used for packing the conductive paste 50 into the via-hole 24 and the trench 24a. Other methods using, for example, a dispenser may be used as long as the packing is ensured.

Then, as shown in FIG. 1D, six single-sided conductive pattern films 21, which have been formed using the steps shown FIGS. 1A to 1C, are stacked. Each of the lower three single-sided conductive pattern films 21 in FIG. 1D are piled such that the side including the conductive patterns 22, 22a faces downward. Each of the upper three single-sided conductive pattern films 21 in FIG. 1D are stacked such that the side including the conductive patterns 22, 22a faces upward. That is, the innermost two single-sided conductive pattern films 21 are stacked together such that the sides that do not include the conductive patterns 22, 22a face each other. Other four single-sided conductive pattern films 21 are piled such that the side that includes conductive patterns 22, 22a faces the side that does not include the conductive patterns 22, 22a.

The above stacking arrangement of the single-sided conductive pattern films 21 permits the conductive patterns 22, 22a to be exposed on two sides of the multilayer circuit board 100 of FIG. 1E, even though the multilayer circuit board 100 is made up of the single-sided conductive pattern films 21. The exposed conductive patterns 22, 22a can be used as terminals that are electrically connected to electric components or outside circuits, so highly dense packaging or miniaturization of multilayer circuit boards can be achieved using the structure of the multilayer circuit board 100.

After the single-sided conductive pattern films 21 are stacked as shown in FIG. 1D, the stacked body is heat pressed from the top and bottom surfaces of the stacked body by a vacuum hot-press machine, which is not illustrated. Specifically, the stacked body is pressed under 1–10 MPa while being heated at 300 to 350° C. for 40–60 minutes. With the heat pressing, as shown in FIG. 1E, the resin films 23 in the single-sided conductive pattern films 21 deform plastically and bond together. Because the resin films 23 are all made of the same thermoplastic resin, the resin films 23 easily bond together. In the multilayer circuit board 100 of FIG. 1E, each of the resin films 23 makes up an insulating layer, and the conductive patterns 22, 22a that have been formed on each of the resin films 23 make up a conductive layer. The conductive layers are separated by the resin films 23.

At the same time, the conductive paste 50 in the via-holes 24 and the trench 24a is sintered to make conductive compounds 51 and create diffusion layers with the adjoining conductive patterns 22, 22a. As a result, pairs of adjoining first conductive patterns 22, 22a are electrically interconnected by the conductive compound 51, and the conductive paste 50 in trenches 24a and the second conductive patterns 22a are joined and integrated to form conductive wires that can be electrified with a high current. With the above manufacturing steps, a multilayer circuit board 100 of FIG. 1E is completed.

The mechanism for the interconnection of the adjoining first conductive patterns 22, 22a and the conductive wire formation will be briefly described next. The conductive paste 50 packed and evaporated in the via-hole 24 and the trench 24a of the single-sided conductive pattern film 21 in FIG. 1C is in the state that tin particles and silver particles are mixed. When the conductive paste 50 is heated at 300–350° C. at the step shown in FIG. 1D, however, the tin particles melt, stick to, and cover the surface of the silver particles because the melting point of the tin particles and that of the silver particles are 232° C. and 961° C., respectively.

As the heating is continued, fused tin begins defusing from the surfaces of the silver particles and an alloy having a melting point of 480° C. is formed between tin and silver. With the formation of the alloy, the conductive compounds 51 made of the alloy are formed in the via-holes 24 and the trenches 24a because the conductive paste 50 is under a pressure of 1–10 MPa. When the conductive compounds 51 are formed, each conductive compound 51 is pressed to each surface of the conductive patterns 22, 22a located at two ends of each of the via-holes 24 and at two ends of each of the trenches 24a.

Therefore, the tin component in each conductive compound 51 and the copper component in the conductive patterns 22, 22a adjoining the conductive compound 51 diffuse mutually, and a solid phase diffusion layer is formed at the boundary between each conductive compound 51 and corresponding conductive patterns 22, 22a to electrically connect the conductive compounds 51 and corresponding conductive patterns 22, 22a.

Figure 2:
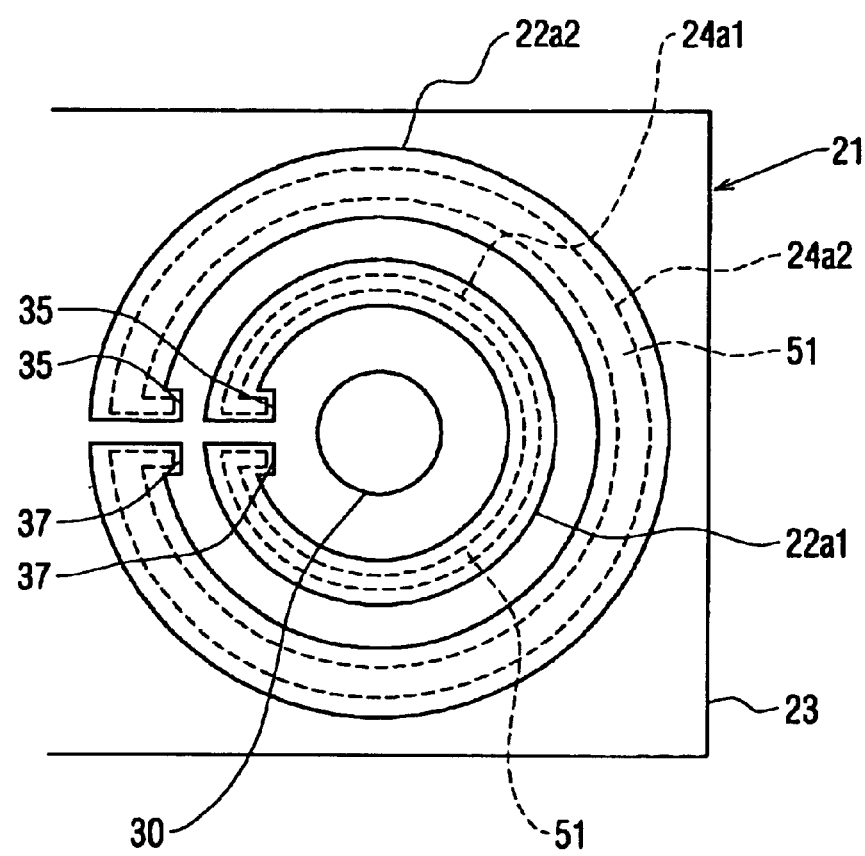
FIG. 2 is a partial plan view of a single-sided conductive pattern film included in a multilayer circuit board, in which a coil has been built.

Next, an application of the multilayer circuit board 100 of FIG. 1E will be described. In the application, a transformer has been built in a multilayer circuit board. The multilayer circuit board is made up of a plurality of single-sided conductive pattern films 21, one of which is shown in FIG. 2. In the single-sided conductive pattern film 21 of FIG. 2, inner and outer conductive patterns 22a1, 22a2, which are substantially annular, have been coaxially formed on a thermoplastic resin film 23. A conductive compound 51 is located in each of trenches 24a1, 24a2, which are respectively bottomed by the conductor patterns 22a1, 22a2. Each of the conductive patterns 22a1, 22a2 includes a first terminal 35 and a second terminal 37.

The inner conductive pattern 22a1 of FIG. 2 has been electrically connected at the first terminal 35 to a substantially annular inner conductive pattern 22a1 of an upper single-sided conductive pattern film 21, which is located in front of the conductive pattern 22a1 of FIG. 2, by a conductive compound 51 of the upper single-sided conductive pattern film 21. The inner conductive pattern 22a1 of FIG. 2 also has been electrically connected at the second terminal 37 to a substantially annular inner conductive pattern 22a1 of a lower single-sided conductive pattern film 21, which is located behind the conductive compound 51 of FIG. 2, by the conductive compound 51 of FIG. 2.

In the same manner, the outer conductive pattern 22a2 of FIG. 2 has been electrically connected at the first terminal 35 to an outer conductive pattern 22a2 of the upper single-sided conductive pattern film 21, and also has been electrically connected at the second terminal 37 to an outer conductive pattern 22a1 of the lower single-sided conductive pattern film 21. By serially connecting the conductive patterns 22a1, 22a2 between a plurality of single-sided conductive pattern films 21, first and second coils have been formed using the inner conductive patterns 22a1 and the outer conductive patterns 22a2 in the multilayer circuit board of the application.

In the upper and lower single-sided conductive pattern films 21, the diameters of the substantially annular inner and outer conductive patterns 22a1, 22a2 are different from those of the conductive patterns 22a1, 22a2 of FIG. 2 in order to prevent the conductive patterns 22a1, 22a2 from being electrically connected along the entire conductive compounds 51 between the single-sided conductive pattern film 21 of FIG. 2 and each of the upper and lower single-sided conductive pattern films 21.

As shown in FIG. 2, a core 30 of the transformer formed using the first and second coils is located in a through hole that extends through the multilayer circuit board of the application along the common axis of the first and second coils. The conductive compounds 51 of FIG. 2 are shaped corresponding to the shapes of the conductive patterns 22a1, 22a2, respectively.

The multilayer circuit board of the application, which has a built-in transformer, is manufactured in the same manner as the multilayer-circuit board 100 of FIG. 1E is manufactured. Specifically, trenches 24a1, 24a2, which are respectively bottomed by inner and outer conductive patterns 22a1, 22a2, are formed using laser. Then, a low resistivity conductive paste 50 is packed in the trenches 24a1, 24a2. A plurality of single-sided conductive pattern films 21 are stacked, and the stacked body is heat pressed.

With the heat pressing, the conductive paste 50 in the trenches 24a1, 24a2 is sintered to make conductive compounds 51 and simultaneously integrated with corresponding conductive patterns 22a1, 22a2. As a result, each of the coils of the transformer in the multilayer circuit board of the application has a high current-carrying capacity without thickening conductive patterns 22a1, 22a2.

Other Embodiments

The multilayer circuit board 100 of FIG. 1E is formed using the single-sided conductive pattern films 21 alone. However, other than single-sided conductive pattern films 21, double-sided conductive pattern films and resin films without conductor patterns may be used. The double-sided conductive pattern films, the single-sided conductive pattern films 21, and the resin films without conductor patterns may be combined on a case-by-case basis to form a multilayer circuit board.

In the single-sided conductive pattern film 21 of FIG. 1C, the trench 24a extends through the resin film 23 and bottomed by the second conductor pattern 22a. However, the trench 24a does not necessarily need to extend through the resin film 23. Instead, the trench 23 may be shallower than the thickness of the resin film 23. In that case, a trench shallower than the thickness of a resin film is formed in the resin film at a predetermined area. Then, a conductive paste is packed in the trench, and a conductive foil is plastered to the resin film to cover the trench. Then, a conductive pattern is patterned out of the conductive foil using etching to complete a single-sided conductive pattern film.

The thermoplastic resin films 23 of FIGS. 1A to 1E are made of liquid crystal polymer. Instead, thermoplastic resin films made of a mixture of 65–35 weight % polyetheretherketone resin and 35–65 weight % polyetherimide resin may be used. Not limited to this, it is possible to use a film made by adding nonconductive filler to polyetheretherketone resin and polyetherimide resin. It is also possible to use a film made of polyetheretherketone (PEEK) or polyetherimide (PEI) alone. Moreover, thermoplastic resin films made of thermoplastic polyimide, polyethylene telephthalate (PET), or polyphenylene sulfide (PPS) may be used.

In addition, instead of the thermoplastic resin films 23, a film prepared by forming adhesive layers on a thermoplastic resin film may be used as an insulating layer in a multilayer circuit board.

The multilayer circuit board 100 of FIG. 1 is includes six single-sided conductive pattern films 21. However, as a matter of course, the number of the single-sided conductive pattern films 21 is not limited to six.

What is claimed is:

1. A method for manufacturing a multilayer circuit board, in which a plurality of insulating layers and a plurality of conductive layers, each of which includes conductive patterns, are laminated, the method comprising:
   preparing a conductive pattern film, the preparing including:
   forming a conductive pattern on an insulating layer, the conductive pattern continuously extending along a surface of the insulating layer for at least a predetermined length on a surface of the insulating layer;
   forming a trench in the insulating layer which is adjacent to the conductive pattern, the trench continuously extending along the conductive pattern for the predetermined length; and
   packing a low resistivity conductive paste, which includes metal particles, in the trench;
   stacking the conductive pattern film and an insulating layer to form a stacked body; and
   heat pressing the stacked body such that the insulating layers bond together, the conductive paste is sintered to form a conductive compound, which is electrically connected to the conductive pattern, and the conductive compound in the trench and the conductive pattern form a conductive wire that has a higher current-carrying capacity with respect to a direction parallel to the surface of the insulating layer than that of the conductive pattern only.

2. The method according to claim 1, wherein the trench is formed to extend through the insulating layer and be bottomed by the conductive pattern.

3. The method according to claim 2, wherein the trench is formed to have a width narrower than that of the conductor pattern.

4. The method according to claim 1, wherein the insulating layer is formed to have a thickness of 10 to 200 $\mu$m and wherein the conductor pattern is formed to have a thickness of 5 to 75 $\mu$m.

5. The method according to claim 1, wherein said conductive pattern is designated as a first conductive pattern, and the steps further comprises:
   forming a second conductive pattern on an insulating film, the second conductive pattern being formed in parallel with the first conductive film, wherein the trench is formed in the insulating layer which is placed between the first and second conductive patterns when the insulating layers are stacked.

6. A method for manufacturing a multi-layer circuit board, the method comprising:

preparing a plurality of insulating films made of thermoplastic resin, which are prepared to be stacked in a predetermined order;

forming conductive patterns on the insulating films, the conductive patterns including first conductive patterns and a second conductive pattern;

forming a plurality of via holes and a trench in the insulating layers, the via holes being formed on locations on which at least one of the first conductive patterns exist, and the trench being formed on a location on which the second conductive pattern exists;

filling a low resistive conductive paste in the via holes and the trench;

stacking the insulating films after the preceding steps are completed;

heat pressing the stacked body such that the insulating layers bond together, the conductive paste is sintered to form a conductive compound, which is electrically connected to the first and second conductive patterns, wherein the conductive compound in the via holes provide perpendicular current paths with respect to a surface of the insulating films, and the conductive compound in the trench cooperates with the second conductive pattern to provide a parallel current path with respect to the surface of the insulating films, the parallel current path having a higher current-carrying capacity than that of the first conductive pattern only.

7. The method for manufacturing a multi-layer circuit board according to claim 6, wherein the conductive patterns forming step further forms a third conductive pattern on one of the insulating layer, the third conductive pattern being placed in parallel with the second conductive pattern when the insulating films are stacked; and the trench forming step penetrates the insulating film placed between the second and third conductive films, and the conductive compound in the trench cooperates with both the second and third conductive pattern to provide the parallel current path.

8. The method for manufacturing a multi-layer circuit board according to claim 7, wherein the second and third conductive patterns extend for a predetermined length with a predetermined width; and the trench has a width narrower than that of the second and third conductor patterns.

9. The method for manufacturing a multi-layer circuit board according to claim 8, wherein the via holes are apparently smaller than the trench.

10. The method for manufacturing a multi-layer circuit board according to claim 6, wherein the second conductive pattern extends for a predetermined length with a predetermined width; and the trench has a width narrower than that of the second conductor pattern.

11. The method for manufacturing a multi-layer circuit board according to claim 10, wherein the via holes are apparently smaller than the trench.

* * * * *